(12) United States Patent
Johnson et al.

(10) Patent No.: US 9,443,615 B2
(45) Date of Patent: Sep. 13, 2016

(54) METHODS AND APPARATUSES FOR MEMORY TESTING WITH DATA COMPRESSION

(71) Applicant: Micron Technology, Inc., Boise, ID (US)

(72) Inventors: Jason M. Johnson, Meridian, ID (US); Justin Wood, Boise, ID (US); Gregory S. Hendrix, Boise, ID (US); Mark D. Franklin, Boise, ID (US); Daniel F. Eichenberger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 13/693,899

(22) Filed: Dec. 4, 2012

(65) Prior Publication Data
US 2014/0157066 A1    Jun. 5, 2014

(51) Int. Cl.
*G11C 29/00* (2006.01)
*G11C 29/40* (2006.01)

(52) U.S. Cl.
CPC .................... *G11C 29/40* (2013.01)

(58) Field of Classification Search
CPC .................................................. G11C 29/40
USPC ................................................ 714/718, 719
See application file for complete search history.

(56) References Cited

U.S. PATENT DOCUMENTS

| 5,377,344 | A | 12/1994 | Stager et al. |
| 5,717,701 | A * | 2/1998 | Angelotti ......... G01R 31/31855 714/30 |
| 6,219,283 | B1 | 4/2001 | Wilford |
| 6,311,299 | B1 * | 10/2001 | Bunker ........................ 714/719 |
| 7,657,802 | B2 * | 2/2010 | Naso ............................ 714/718 |
| 2011/0264969 | A1 * | 10/2011 | Okukawa et al. ............ 714/718 |
| 2012/0127804 | A1 | 5/2012 | Ong et al. |

FOREIGN PATENT DOCUMENTS

WO    WO 2010/030561 A2    3/2010

* cited by examiner

*Primary Examiner* — Sam Rizk
(74) *Attorney, Agent, or Firm* — Dorsey & Whitney LLP

(57) ABSTRACT

Apparatuses and methods for memory testing with data compression is described. An example apparatus includes a plurality of latch test circuits, wherein each of the plurality of latch test circuits is coupled to a corresponding global data line of a memory. Each of the latch test circuits is configured to receive test data and is configured to latch data from the corresponding global data line or a corresponding mask bit. Each of the plurality of latch test circuits is further configured to output data based at least in part on the corresponding mask bit. A comparison circuit is coupled to an output of each of the latch test circuits and is configured to compare output data provided by each of the latch test circuits and provide a comparator output having a logical value indicative of whether all the output data matches.

21 Claims, 4 Drawing Sheets

METHODS AND APPARATUSES FOR MEMORY TESTING WITH DATA COMPRESSION

TECHNICAL FIELD

Embodiments of the invention relate generally to electronic memories, and more particularly, in one or more of the illustrated embodiments, to data compression that may be used during testing of electronic memories.

DESCRIPTION OF RELATED ART

Advances in technology have resulted in high density memory architecture. Memory requires testing during various stages of the fabrication process, as well as during installation and use. In order to more efficiently test memory, data compression may be used during testing. Testing using data compression may involve testing blocks of memory cells by comparing data written to memory bit cells against one another. Comparing memory cell data against one another may limit flexibility in the test patterns that can be written to the memory cells and tested. Comparing memory cell data against one another may also limit visibility into verification of the actual data read from a memory cell.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments.

Figure 1:
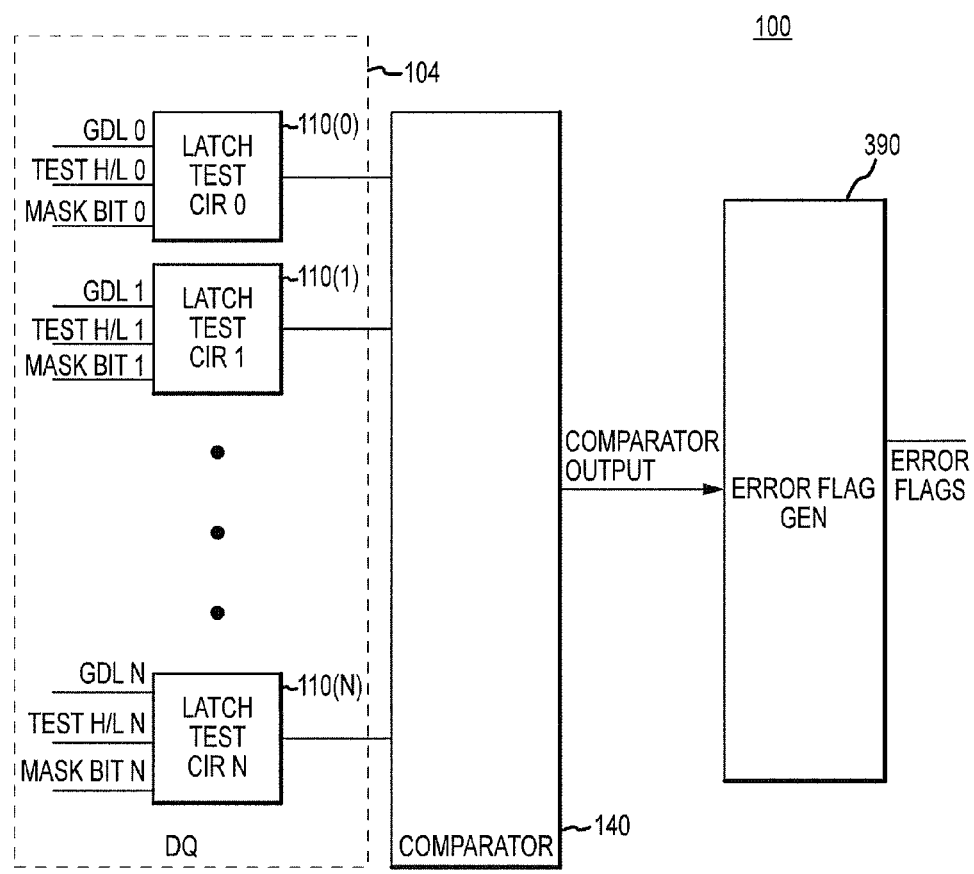
FIG. 1 is a block diagram of a particular illustrative embodiment of an apparatus including a data compression circuit.

Referring to FIG. 1, a particular illustrative embodiment of an apparatus (e.g., an integrated circuit, a memory device, a memory system, an electronic device or system, a smart phone, a tablet, a computer, a server, etc.) including a portion of a data compression circuit is disclosed and generally designated 100. The apparatus 100 may provide configurable testing using various test patterns. The apparatus 100 may include a data queue (DQ) 104 that includes N+1 latch test circuits, such as latch test circuits 110(0)-110(N). Each of the latch test circuits 110 may be coupled to a comparator 140. The latch test circuits may provide flexible testing of a memory.

Each of the latch test circuits may be coupled to a respective global data line (GDL) to latch data provided from memory on the respective GDL. For example, the latch test circuit 110(0) is coupled to a GDL 0, the latch test circuit 110(1) is coupled to a GDL 1, and the latch test circuit 110(N) is coupled to a GDL N. In an embodiment, each latch test circuit 110 may latch data provided on the respective GDL. A number of latch test circuits may be based on a number of the GDLs provided to the DQ. For example, the DQ 104 may include up to N+1 latch test circuits, each coupled to a respective one of N+1 GDLs. In an embodiment, N+1 is any power of two, for example, N+1 may be 32.

During operation, a test mask may be applied to the DQ 104 by latching a corresponding mask bit of the test mask in each of the latch test circuits (e.g., mask bit 0 in the latch test circuit 0 110, mask bit 1 in the latch test circuit 1 120, and/or mask bit N in the latch test circuit N 130). A size of the mask may correspond to a size of the DQ. The test mask may be any bit pattern of ones and zeroes. Further, each of the latch test circuits may store a corresponding data bit retrieved from memory via the respective GDL. Each of the test latch circuits 110 may also receive a test data signal. The test data signal may be configured to a logical high value or a logical low value.

After applying the test mask, a prefetch operation is initiated to provide memory data stored in memory to the GDLs of the DQ 104. The data provided on the GDLs may correspond to a test pattern written to memory prior to latching the test mask. After the prefetch operation, the memory data provided on each of the GDLs may be latched at the corresponding latch test circuit. Based on the latched mask bit, each of the latch test circuits 110 may provide the latched memory data or the test data signal to the comparator 140. For example, when a first mask bit latched at the latch test circuit 110(0) has a first logical value, the latch test circuit 110(0) may provide the latched memory data to the comparator 140. Further, when the first mask bit latched at the latch test circuit 110(0) has a second logical value, the latch test circuit 0 110 may provide the test signal to the comparator 140. Similarly, a second mask bit stored at the latch test circuit 110(1) provides the latched memory data to the comparator 140 when the second mask bit has the first logical value and provides the test data signal to the comparator 140 when the second mask bit has the second logical value. The latch test circuit 110(N) may operate in a similar manner as the latch test circuit 110(0) and the latch test circuit 110(1).

The comparator 140 may perform a comparison of the output data received from each of the latch test circuits 110 with each other. The comparator 140 may provide a comparator output having a first logical value when all of the output data from the latch test circuits 110 have the same logical value, which may be indicative of not detecting any defective memory. The comparator 140 may provide the comparator output having a second logical value when at least one of the output data from the latch test circuits 110 does not have the same logical value, which may be indicative of detecting defective memory. For example, one or more of the output data from the latch test circuits 110 having a logical value different than the other output data may be indicative of defective memory for those output data. In some embodiments, the comparison performed by the comparator 140 initially compares pairs of output data from the latch test circuits 110, and then further compares the results from the initial comparison. For example, first output data received from the latch test circuit 110(0) is compared against second output data received from the latch test circuit 110(1). Further, Nth−1 output data received from a Nth−1 latch test circuit (not shown) may be compared with Nth output data from the latch test circuit N 130. The comparator 140 may generate a comparator output based on the comparison, which may be used to indicate that defective memory has been detected. The comparator output provided by the comparator 140 may be provided to a error flag generator (not shown) to generate an error flag based on the comparator output.

The comparator 140 may provide output data to the error flag generator 390. The error flag generator 390 may generate one or more error flags based on failures detected in the output data received from the comparator 140. For example, the error flag generator 390 provides one or more error flags to a tester (not shown) in response to detection of an error in the output data received from the comparator 140.

Memory testing using a data compression circuit without the test latch circuit may require that a test pattern stored in the memory consist of a single value. Further, memory cell errors may be undetected if memory cells corresponding to two compared GDLs fail in the same manner (i.e. each cell corresponding to two compared GDLs flip from a zero to a one or flip from a one to a zero).

Figure 2:
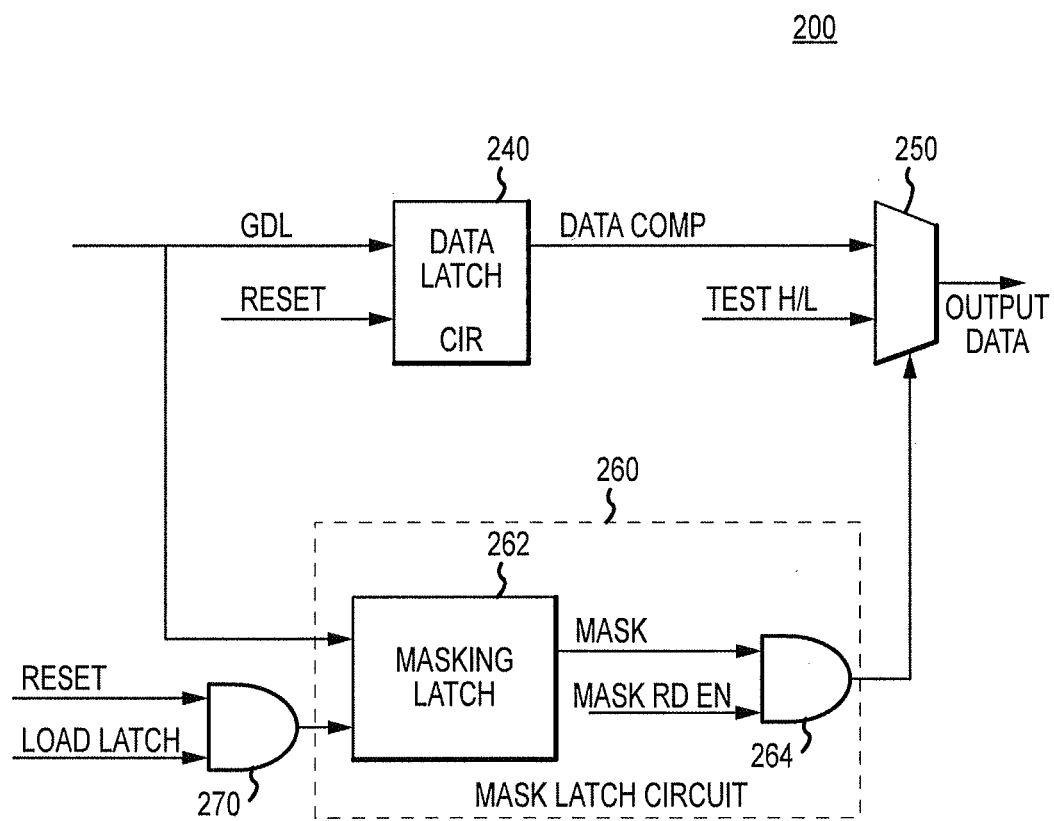
FIG. 2 is a block diagram of a particular illustrative embodiment of a data latch circuit.

Referring to FIG. 2, a latch test circuit 200 according to an embodiment of the invention is disclosed. The latch test circuit 200 may include a data latch circuit 240 and a masking latch circuit 260 coupled to a multiplexer 250. The system 200 may provide a configurable data compression for testing a memory.

The data latch circuit 240 may be coupled to a global data line (GDL). The data latch circuit 240 may also receive a reset signal. The data latch circuit 240 may provide a data comparison signal DATA COMP to the multiplexer 250. The DATA COMP signal may be based on the data provided on the GDL to the data latch circuit 240.

The masking latch circuit 260 may be coupled to the GDL. The masking latch circuit 260 may provide a control signal to the multiplexer 250. The masking latch circuit 260 may include a masking latch 262 that is configured to receive a reset signal RESET and a load enable signal LOAD LATCH and further configured to provide a mask bit MASK. The reset and load enable signal may be separate signals passed through load enable logic 270. The control signal output from the masking latch circuit 260 may be based on the MASK bit. In a particular embodiment, the control signal is provided from control signal logic 264, and is based on the MASK bit and is further based on a mask read enable signal MASK RD EN. Although shown in FIG. 2, in some embodiments the control signal logic 264 and the MASK RD EN signal are not included. In such embodiments, the MASK bit may be provided to the multiplexer 250 as the control signal, rather than through the control signal logic 264.

The multiplexer 250 may selectively provide the DATA COMP signal from the data latch circuit 240 or a test high/low (H/L) signal based on the control signal provided by the masking latch circuit 260. The latch test circuit 200 may be used for the latch test circuits 110 of FIG. 1.

A load mask latch operation is performed to latch a mask bit in the masking latch 262 of the masking latch circuit 260, and includes a mask latch write operation and mask latch read operation. During the load mask operation, the masking latch 262 is enabled by the LOAD LATCH signal. During the mask write operation, the mask bit may be provided on the GDL and held at a sense amplifier coupled to the GDL. During the mask write operation, word lines coupled to the GDL are deactivated to prevent writing the mask bit to a memory cell. During the mask read operation, the mask bit is driven on the GDL and latched at the masking latch 262. The mask bit may also be latched at the data latch circuit 240, but will be overwritten during a subsequent prefetch operation. Upon completion of the load mask operation, the masking latch 262 is disabled to prevent overwriting the mask bit latched at the masking latch 262.

After the load mask latch operation, a prefetch operation is performed. Data to be used for the comparison is provided on the GDL during the prefetch operation. The data may be latched at the data latch circuit 240. The data is not latched at the masking latch 262 because the masking latch 262 is disabled, as previously discussed. The data latched by the data latch 240 is provided as the DATA COMP signal to the multiplexer 250.

The multiplexer 250 may be configured to receive the DATA COMP signal at a first input and the test H/L signal at a second input. The multiplexer 250 may also be configured to receive the control signal from the masking latch circuit 260 at a control input. The multiplexer 250 may provide output data based on the control signal. For example, when the mask bit has a first logical value, the control signal controls the multiplexer 250 to provide the DATA COMP signal as the output data. When the mask bit has a second logical value, the control signal may control the multiplexer 250 to provide the test H/L signal as the output data. In an embodiment that includes the control signal logic 264 and the MASK RD EN signal, the control signal is also based on a value of the MASK RD EN signal. For example, when the MASK RD EN signal is activate (e.g., the MASK RD EN signal is a logical "1"), the control signal controls the multiplexer 250 based on the MASK bit as described previously. Further, when the MASK RD EN signal is not active (e.g., the MASK RD EN signal is a logical "0"), the control signal controls the multiplexer 250 to provide the DATA COMP signal as the output data regardless of a value of the MASK bit.

It will be appreciated by those skilled in the art that each GDL, as described with reference to FIG. 1, may be coupled to a corresponding latch test circuit 200. It will also be appreciated by those skilled in the art that a value of the mask bit corresponding to the GDL may be set in context of an overall masking pattern applied to each GDL under test.

The latch test circuit 200 may allow memory data provided on the GDL to be substituted with data as represented by a test H/L signal during testing. Using the test H/L signal as output data may allow verification of an output data value corresponding to another GDL, rather than only being able to verify a match between the output data corresponding to the GDL and the output data corresponding to the other GDL.

The latch test circuit 200 can be used to control the logical value of output data provided to a comparator, for example, comparator 140 of FIG. 1. That is, the output data of a latch test circuit may be the memory data provided to the latch test circuit on the GDL, or the test H/L signal. The selection of which to provide as the output data is based on the mask bit. As a result, a comparator that provides a comparator output having a logical value indicative of all the output data matching may be used although the memory data provided to the respective latch test circuits are not all the same (e.g., a test pattern of different logical values are written to memory). For the latch data circuits that provided memory data having a different logical value than the other latch data circuits, the mask bit can control the multiplexer to provide the logical value represented by the test H/L signal rather than the memory data having the different logical value. Providing a test H/L signal having a logical value that is the same as the output data provided by the other latch data circuits will result in the different memory data being ignored. Thus, a test pattern having different logical values written to memory may be used for testing even though the comparator is configured to compare the output data from the latch data circuits for the same logical values.

Figure 3:
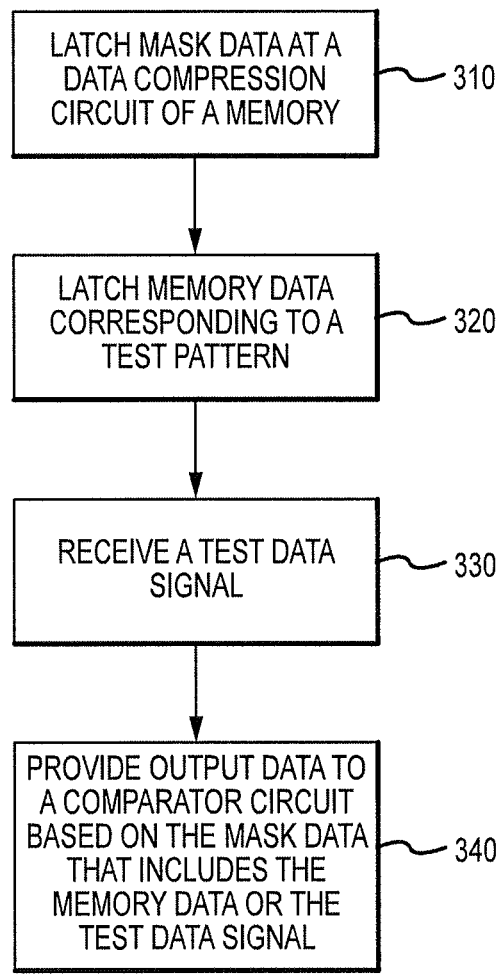
FIG. 3 is a flow chart of a particular illustrative embodiment of a method of testing a memory.

Referring to FIG. 3, a flow chart of a particular illustrative embodiment of a method of performing a data compression test is designated 300. The method 300 may be performed by the apparatus 100 of FIG. 1.

The method 300 may include latching mask data at a data compression circuit of a memory, at step 310. The data compression circuit may include the 100 of FIG. 1. Latching mask data at a data compression circuit may include receiving the mask data from global data lines. Latching mask data at a data compression circuit may further include enabling sense amplifiers coupled to global data lines and disabling word lines to prevent inadvertent writing of the mask data to the memory. Latching mask data at a data compression circuit may further include providing the mask data to the global data lines. The mask data may be maintained by the sense amplifiers thereby loading the mask data at a mask latch circuit. Latching mask data at a data compression circuit may further include reading the mask data from the sense amplifiers via the global data lines and latching the mask data at a mask latch circuit. The method 300 may further include enabling a masking latch to latch the mask data provided via the global data lines.

The method 300 may further include latching memory data corresponding to a test pattern written to memory, at step 320. The memory data may be latched, for example, at the latch test circuit 110(0), the latch test circuit 110(1), and/or the latch test circuit 110(N) of FIG. 1. The memory data may be written to the memory prior to latching the mask data, at 310. Latching memory data corresponding to a test pattern may include prefetching the memory data. The prefetched memory data may be provided on global data lines. The method 300 may further receive a test data signal, at step 330. The test data signal may have a logical high value or a logical low value.

The method 300 further includes providing output data to a comparator circuit based on the mask data, at step 340. The comparator circuit may include the comparator 140 of FIG. 1. The output data includes the memory data or the test data signal state. Providing output data to a comparator circuit based on the mask data may include selecting memory data corresponding to a particular global data line of the global data lines when a mask bit of the mask data corresponding to the particular global data line has a first logical value. Providing output data to a comparator circuit based on the mask data may further include selecting the test data signal when the mask bit corresponding to the particular global data line has a second logical value. The method 300 may further include comparing bits included in the output data against one another to generate an error flag.

The method 300 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 300 of FIG. 3 can be initiated by a processor that executes instructions by providing data and control signals to the data compression test circuit and memory.

Figure 4:
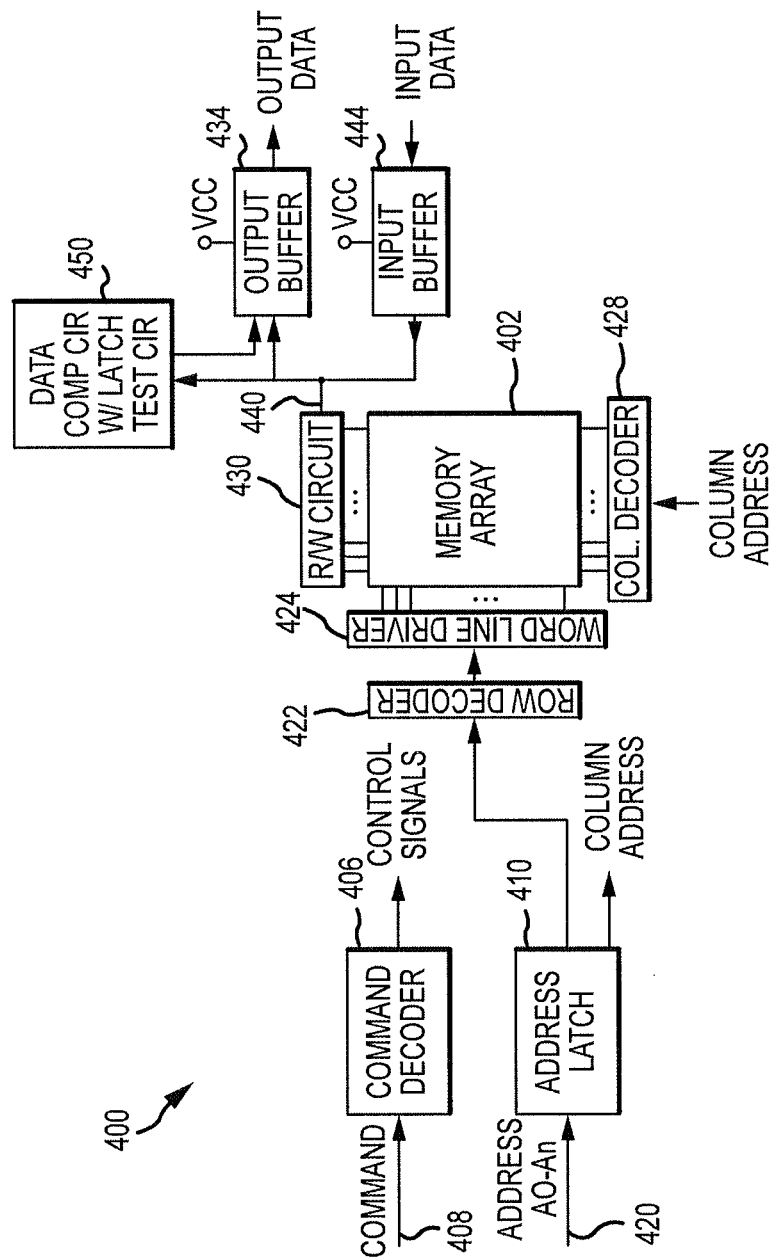
FIG. 4 is a block diagram of a memory including a data compression circuit according to an embodiment of the invention.

Referring to FIG. 4, block diagram of a memory 400 including a data compression circuit according to an embodiment of the invention. The memory 400 may include an array 402 of memory cells, which may be, for example, DRAM memory cells, SRAM memory cells, flash memory cells, or some other types of memory cells. The memory 400 includes a command decoder 406 that may receive memory commands through a command bus 408 and generate corresponding control signals within the memory 400 to carry out various memory operations. Row and column address signals may be applied to an address latch 410 in the memory 400 through an address bus 420. The address latch 410 may then output a separate column address and a separate row address.

The address latch 410 may provide row and column addresses to a row address decoder 422 and a column address decoder 428, respectively. The column address decoder 428 may select bit lines extending through the array 402 corresponding to respective column addresses. The row address decoder 422 may be connected to a word line driver 424 that activates respective rows of memory cells in the array 402 corresponding to received row addresses. The selected data line (e.g., a bit line or bit lines) corresponding to a received column address may be coupled to a read/write circuitry 430 to provide read data to a data output buffer 434 via an input-output data bus 440. Write data may be applied to the memory array 402 through a data input buffer 444 and the memory array read/write circuitry 430. The command decoder 406 may respond to memory commands applied to the command bus 408 to perform various operations on the memory array 402. In particular, the command decoder 406 may be used to generate internal control signals to read data from and write data to the memory array 402.

The memory 400 may further include a data compression circuit 450. The data compression circuit 450 may include the 100 of FIG. 1, and may be capable of performing the method 400 of FIG. 4. For example, the data compression circuit 450 configured to perform data compression testing according to one of the embodiments described above or some other embodiment. The data compression circuit 450 may be configured to latch mask data, latch memory data, perform a comparison of output data generated based on the mask data and the latched memory data. In addition, the data compression circuit 450 may generate error flags based on errors detected during the comparison.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:
a plurality of latch test circuits, wherein each of the plurality of latch test circuits is coupled to a corresponding global data line of a memory, wherein each of the plurality of latch test circuits is configured to receive test data, configured to receive latch data from the corresponding global data line, and configured to latch a corresponding mask bit, wherein each of the plurality of latch test circuits is further configured to provide one of the test data or the data from the corresponding global data line as respective output data based on the corresponding mask bit, wherein the respective output data provided by each of the latch test circuits is the data from the respective memory when the mask bit has a first logical value and wherein the output data provided by each of the latch test circuits is the test data when the corresponding mask bit has a second logical value; and
a comparison circuit coupled to an output of each of the plurality of latch test circuits, the comparison circuit configured to determine whether the respective output data provided by each of the plurality of latch test circuits has a matching logical value, the comparator further configured to provide a comparator output having a logical value that is based on whether the respective output data provided by each of the plurality of latch test circuits has the matching logical value.

2. The apparatus of claim 1, wherein each of the latch test circuits includes a corresponding mask latch circuit configured to store the corresponding mask bit.

3. The apparatus of claim 2, wherein each of the corresponding mask latch circuits is coupled to a mask latch read enable signal, and wherein the output data provided by each of the latch test circuits is further based on the mask latch read enable signal.

4. The apparatus of claim 1, wherein each of the latch test circuits includes a corresponding data latch circuit configured to store the data from the respective memory.

5. The apparatus of claim 1, wherein each of the latch test circuits includes a corresponding selection circuit configured to select, based on the corresponding mask bit, one of data from a respective memory via the corresponding global data line or the test data.

6. The apparatus of claim 5, wherein each of the corresponding selection circuits includes a multiplexer having a first input configured to receive the data from a respective memory via the corresponding global data line, a second input configured to receive the test data; and a control input configured to receive the corresponding mask bit data.

7. An apparatus, comprising:
a memory array coupled to the plurality of global data lines, the memory array including a plurality of memory cells;
a data compression circuit coupled to the plurality of global data lines via a corresponding sense amplifier circuit, the data compression circuit comprising:
a plurality of latch test circuits, wherein each of the plurality of latch test circuits is configured to receive memory data from a respective global data line, and configured to receive a mask bit and test data; each of the latch test circuits configured to provide the memory data as respective output data responsive to the mask bit having a first logical value and to provide the test data as the respective output data responsive to the mask bit having a second logical value; and
a comparison circuit coupled to an output of each of the latch test circuits, the comparison circuit configured to determine whether the respective output data provided by each of the plurality of latch test circuits has a matching logical value.

8. The apparatus of claim 7, wherein data stored at the plurality of memory cells of the memory array is a test pattern.

9. The apparatus of claim 7, wherein the corresponding mask bit is driven on the global data line during a write operation while the corresponding plurality of memory cells are disabled, and wherein the corresponding mask bit is read from the corresponding global data line during a read operation.

10. The apparatus of claim 7, wherein the determination of whether the respective output data provided by each of the plurality of latch test circuits has a matching logical value by the comparison circuit includes comparing the respective output data received from each of the plurality of latch test circuits against one another.

11. The apparatus of claim 7, further comprising an error flag generator coupled to the comparison circuit, and configured to receive determination results from the comparison circuit and to generate one or more error flags based on the determination results.

12. A method, comprising:
latching mask data at a plurality of latch circuits associated with a data compression circuit of a memory;
responsive to latching the mask data, latching memory data;
receiving test data at the plurality of latch circuits;
providing memory data to a comparator circuit as output data, responsive to a mask bit having a first logical value;
providing test data to the comparator circuit as the output data, responsive to the mask bit having a second logical value; and
comparing at the comparator circuit, bits of the output data to output a logical value.

13. The method of claim 12, further comprising receiving a load enable signal, wherein latching the mask data is conditioned upon the load enable signal being activated.

14. The method of claim 12, wherein latching the mask data comprises:
receiving the mask data from global data lines corresponding to the data queue of the memory.

15. The method of claim 14, wherein latching the mask data further comprises:
enabling sense amplifiers coupled to the global data lines;
disabling word lines to corresponding to memory cells coupled to the global data lines;
writing the mask data to the global data lines, wherein the mask data is stored at the sense amplifiers; and
reading the mask data from the sense amplifiers via the global data lines.

16. The method of claim 12, further comprising:
selecting the memory data from a particular global data line of the global data lines when the mask bit associated with the particular global data line has the first logical value; and
selecting the test data when the mask bit associated with the particular global data line has the second logical value.

17. The method of claim 12, further comprising receiving a mask latch read enable signal, wherein providing the memory data to the comparator circuit is based at least partly on the mask latch read enable signal, and wherein providing the test data to the comparator circuit is based at least partly on the mask latch read enable signal.

18. The method of claim 12, wherein a value of the test data signal is one of a logical high value or a logical low value.

19. The method of claim 12, further comprising, writing the memory data to the memory prior to latching the mask data.

20. The method of claim 12, further comprising, responsive to latching the mask data, prefetching the memory data, wherein the prefetched data is driven on global data lines coupled to the data queue.

21. The method of claim 12, wherein comparing the bits included in the output data comprises comparing the bits included in the output data to generate an internal error flag.

* * * * *